United States Patent
Chih et al.

(10) Patent No.: US 11,755,410 B2
(45) Date of Patent: *Sep. 12, 2023

(54) SYSTEMS AND METHODS FOR CORRECTING DATA ERRORS IN MEMORY

(71) Applicant: Taiwan Semiconductor Manufacturing Company Limited, Hsinchu (TW)

(72) Inventors: Yu-Der Chih, Hsinchu (TW); Ching-Huang Wang, Taoyuan County (TW); Yi-Chun Shih, Taipei (TW); Meng-Chun Shih, Hsinchu (TW); C. Y. Wang, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/873,262

(22) Filed: Jul. 26, 2022

(65) Prior Publication Data

US 2022/0358013 A1    Nov. 10, 2022

Related U.S. Application Data (60) Continuation of application No. 17/178,651, filed on Feb. 18, 2021, now Pat. No. 11,429,482, which is a
(Continued)

(51) Int. Cl.
*G06F 11/10* (2006.01)
*G11C 17/16* (2006.01)
(Continued)

(52) U.S. Cl.
CPC .......... *G06F 11/1068* (2013.01); *G06F 3/064* (2013.01); *G06F 3/0619* (2013.01);
(Continued)

(58) Field of Classification Search
CPC .... G06F 11/1068; G06F 3/0685; G06F 3/064; G06F 3/0638; G06F 3/0619;
(Continued)

(56) References Cited

U.S. PATENT DOCUMENTS 5,574,684 A    11/1996  Tomoeda
5,592,422 A     1/1997  McClure
(Continued)

OTHER PUBLICATIONS

Reichelt, et al.; Accelerating the Temperature Cycling Tests of FBGA Memory Components with Lead-free Solder Joints without Changing the Damage Mechanism; 2009 European Microelectronics and Packaging Conference; Rimini, Italy; pp. 1-8; 2009.

*Primary Examiner* — Cynthia Britt
(74) *Attorney, Agent, or Firm* — Jones Day (57) ABSTRACT

Systems and methods for correcting data errors in memory caused by high-temperature processing of the memory are provided. An integrated circuit (IC) die including a memory is formed. Addresses of memory locations that are susceptible to data loss when subjected to elevated temperatures are determined. Bits of data are written to the memory, where the bits of data include a set of bits written to the memory locations. The set of bits are written to a storage device of the IC die that is not susceptible to data loss when subjected to the elevated temperatures, the subset of bits comprise compressed code. At least one of the bits stored at the addresses is overwritten after subjecting the IC die to an elevated temperature. The at least one of the bits is overwritten based on the set of bits written to the storage device.

20 Claims, 6 Drawing Sheets

Related U.S. Application Data continuation of application No. 16/295,194, filed on Mar. 7, 2019, now Pat. No. 10,936,413, which is a division of application No. 15/228,294, filed on Aug. 4, 2016, now Pat. No. 10,228,998.

(51) Int. Cl.
| | |
|---|---|
| *G11C 29/44* | (2006.01) |
| *G11C 29/50* | (2006.01) |
| *G11C 29/56* | (2006.01) |
| *G11C 29/00* | (2006.01) |
| *G06F 3/06* | (2006.01) |
| *G11C 29/04* | (2006.01) |
| *G11C 17/18* | (2006.01) |

(52) U.S. Cl.
CPC .......... *G06F 3/0638* (2013.01); *G06F 3/0685* (2013.01); *G06F 11/1048* (2013.01); *G11C 17/16* (2013.01); *G11C 17/18* (2013.01); *G11C 29/44* (2013.01); *G11C 29/50016* (2013.01); *G11C 29/56004* (2013.01); *G11C 29/78* (2013.01); *G11C 2029/0403* (2013.01); *G11C 2029/4402* (2013.01); *G11C 2029/5002* (2013.01)

(58) Field of Classification Search
CPC .................. G06F 11/1048; G11C 29/78; G11C 29/56004; G11C 29/50016; G11C 29/44; G11C 17/18; G11C 17/16; G11C 2029/5002; G11C 2029/4402; G11C 2029/0403; G11C 29/56; G11C 29/42

See application file for complete search history.

(56) References Cited

U.S. PATENT DOCUMENTS

| | | | |
|---|---|---|---|
| 8,019,925 | B1 | 9/2011 | Vogan et al. |
| 8,179,717 | B2 | 5/2012 | Shepard et al. |
| 9,355,929 | B2 * | 5/2016 | Tzafrir ............... G11C 16/3418 |
| 10,088,880 | B2 * | 10/2018 | Sundaram ............ G06F 1/3275 |
| 10,228,998 | B2 * | 3/2019 | Chih ................ G11C 29/56004 |
| 10,936,413 | B2 * | 3/2021 | Chih ................ G11C 29/50016 |
| 11,429,482 | B2 * | 8/2022 | Chih .................... G06F 3/0685 |
| 2010/0169547 | A1 | 7/2010 | Ou |
| 2011/0075482 | A1 | 3/2011 | Shepard et al. |
| 2011/0228604 | A1 * | 9/2011 | Eli ..................... G11C 16/3418 |
| | | | 365/185.09 |
| 2014/0215170 | A1 | 7/2014 | Scarpino et al. |
| 2016/0350183 | A1 | 12/2016 | Lien et al. |
| 2016/0371161 | A1 | 12/2016 | Louie et al. |

* cited by examiner

SYSTEMS AND METHODS FOR CORRECTING DATA ERRORS IN MEMORY

CROSS-REFERENCE TO RELATED APPLICATIONS

This application is a continuation application of U.S. patent application Ser. No. 17/178,651, filed Feb. 18, 2021, entitled "Systems and Methods for Correcting Data Errors in Memory," which is a continuation application of U.S. patent application Ser. No. 16/295,194, filed Mar. 7, 2019, entitled "Systems and Methods for Correcting Data Errors in Memory," which is a divisional application of U.S. patent application Ser. No. 15/228,294, filed Aug. 4, 2016, entitled, "Systems and Methods for Correcting Data Errors in Memory," each of which is incorporated herein by reference in their entirety.

BACKGROUND

An integrated circuit (IC) is an electronic circuit manufactured into the surface of a thin substrate of semiconductor material. ICs are used in virtually all electronic equipment today and have revolutionized the world of electronics. Computers, mobile phones, and other digital home appliances are now inextricable parts of the structure of modern societies, made possible by the low cost of producing ICs. After an IC has been produced, subsequent processing of the IC may include subjecting the IC to relatively high temperatures. For instance, in attaching an IC to a printed circuit board (PCB), the IC is heated to a temperature of approximately 260 degrees Celsius, in some examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

An integrated circuit (IC) die is an electronic circuit manufactured into the surface of a thin substrate of semiconductor material. After an IC die has been produced, subsequent processing of the IC die may include subjecting the IC die to relatively high temperatures. In particular, in attaching an IC die to a printed circuit board (PCB), a reflow process (e.g., a solder reflow process) performed at a relatively high temperature (e.g., 260 degrees Celsius) is commonly utilized. Oftentimes, data stored on a memory formed on the IC die is lost or corrupted as a result of the relatively high-temperature reflow process. When such data loss or corruption occurs, both the IC die and the PCB are typically rendered useless and thus may be scrapped (e.g., disposed of). Such scrapping of IC dies and PCBs is undesirable and can be costly.

Certain types of memory are particularly susceptible to data loss caused by high-temperature processing. For example, emerging memory types such as magnetic random-access memory (also known as magnetoresistive random-access memory or MRAM), resistive random-access memory (RRAM), phase-change random-access memory (PCRAM), and ferroelectric random-access memory (FRAM) are more susceptible to data loss resulting from high-temperature processing than conventional memory types such as flash memory. Thus, when a memory formed on an IC die comprises one of these emerging memory types, the relatively high-temperature reflow process used to attach the IC die to a PCB may cause data to be lost or corrupted in the memory.

The approaches of the instant disclosure provide systems and methods for eliminating or minimizing such data loss caused by high-temperature processing of IC dies. In one embodiment, a screening step is performed to identify memory locations that are susceptible to data loss when subjected to elevated temperatures. The screening step thus identifies "weak bits" of the memory, i.e., memory locations that may experience a change in value as a result of a reflow process (e.g., a bit value of "0" changing to a bit value of "1," and vice versa). After the reflow process is performed at an elevated temperature, data stored in the identified memory locations is checked and corrected, if necessary. The identifying of the weak bits and the correcting of the data helps to ensure that no data is lost as a result of the reflow process.

In another embodiment, both data bits and parity bits are written to the memory. It is noted that the parity bits can include any form of redundant bits to store data, such as check-sum bits, duplicated bits, etc. It is thus noted that the parity bits described herein are not limited to only even/odd parity bits. The parity bits are error check and correction (ECC) parity bits, in examples. After a reflow process is performed at an elevated temperature, the parity bits are used to detect and correct errors in the data bits stored in the memory. Thus, if the reflow process causes any bit values to change, such changes will be detected as errors and subsequently corrected. After correcting the errors, the parity bits are released to free up space in the memory.

Various other embodiments are described herein. In one such embodiment, the memory of the IC die is programmed with compressed code to reduce code size. The use of the compressed code frees up space in the memory, and this space may be used, for example, to store extra parity bits for stronger ECC protection. After reflow, the ECC parity bits are used to correct errors in the stored codes, as described above. Further, the compressed code is decompressed, and the decompressed code is written to the memory. The compressed code is released from the memory, thus freeing up space in the memory. These embodiments and others are described in further detail herein.

Figure 1A:
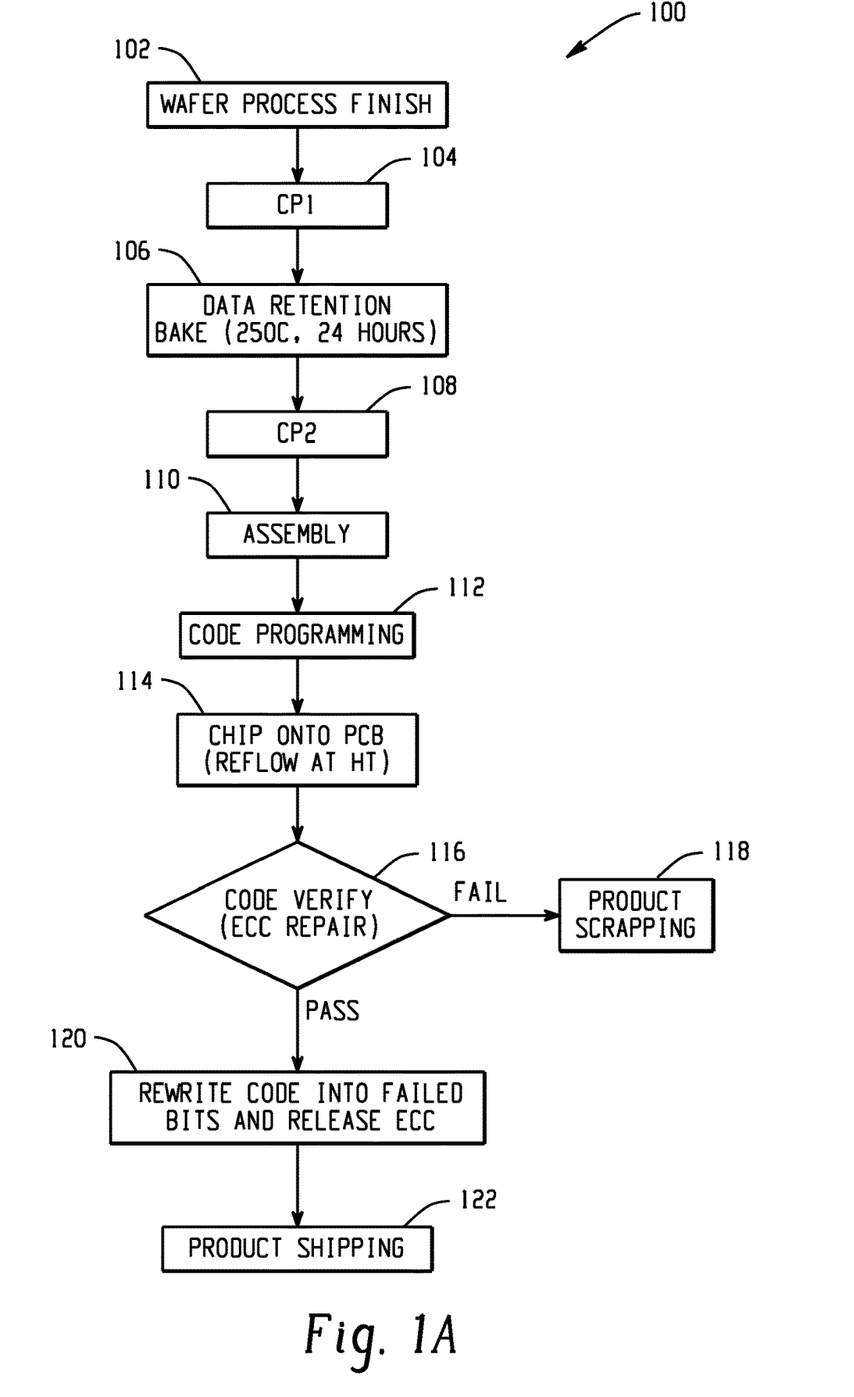
FIG. 1A depicts operations of an example method for forming a device, in accordance with some embodiments.

The approaches of the instant disclosure are implemented in the context of a production flow for processing an IC die, in examples. FIG. 1A depicts operations of an example production flow 100 for processing an IC die, in accordance with some embodiments. At step 102, processing of wafers (e.g., substrates) is completed, yielding multiple IC dies formed on the wafers. In examples, each of the finished IC dies includes one or more memories formed thereon. The one or more memories comprise MRAM, RRAM, PCRAM, FRAM, or another memory type, in examples. Each of the finished IC dies further includes different circuits for various functions, such as microprocessor and logic circuits, in examples.

At step 104, a first chip probing (CP) stage of the production flow is performed. Chip probing stages, known to those of ordinary skill in the art, are used to detect defective dies and are carried out using specialized testing equipment. Typically, a test head of the testing equipment mounts a probe card with a plurality of probe needles or other contact members for contacting with electrodes (e.g., bonding pads, bumps, etc.) of a wafer. The probe card enables the testing equipment to apply a voltage or current to the wafer under test, thus enabling testing to determine if electrical performance is within design specifications. The first CP stage at the step 104 further includes writing test patterns of data to the one or more memories formed on the IC dies.

At step 106, a data retention bake is performed. The data retention bake is a test that is used to measure a device's ability to retain a charge for extended periods of time without applying a voltage bias. Stressing an IC die at relatively high temperatures accelerates a change of memory state (e.g., accelerates a discharge causing a memory state to change). Thus, in examples, the data retention bake includes baking the dies at a relatively high temperature (e.g., 250 degrees Celsius, as shown in FIG. 1A) for a relatively long amount of time (e.g., 24 hours).

At step 108, a second CP stage of the production flow is performed. During the second CP stage, the one or more memories of an IC die are checked to determine if the test patterns written to the memories are still present. In other words, it is determined if the data retention bake caused the test data written to the one or more memories to be lost or corrupted. Various other tests known to those of ordinary skill in the art are performed at the second CP stage to detect defective dies, in examples. Non-defective IC dies are subject to subsequent processing steps (e.g., steps 110, 112, 114 shown in FIG. 1A), and defective dies are removed from further processing.

At step 110, for IC dies determined to be non-defective, an assembly step is performed. In the assembly step, an IC die is assembled into a package. The IC package protects the IC die from physical damage and redistributes input/output of the IC die to a more manageable pitch. The IC package also performs other functions such as providing a structure more amenable to standardization, providing a thermal path away from the die, providing protection from the potential of soft errors due to alpha particles, and providing a structure more easily disposed to electrical test and burn-in. The IC package technology utilized at the step 110 is quad flat pack (QFP), pin grid array (PGA), ball grid array (BGA), flip chip (FC), three dimensional integrated circuit (3DIC), chip scale package, package on package (PoP), or another technology, in examples. In examples, a wafer dicing step is performed prior to the assembly step to separate dies of a particular wafer.

At step 112, a code programming step is performed. In the code programming step, bits of data are written to the memory formed on the IC die. In examples, the bits of data comprise program code (e.g., computer executable instructions) executable by a processor, microcontroller, or state machine, for instance. The steps of FIG. 1A are used, in examples, to manufacture a final product (e.g., device) for a user (e.g., a customer). In such examples, the user may desire that the final product include the memory programmed with the aforementioned program code. Thus, such program code is written to the memory at the step 112, and it is desired that this program code remain in the memory at the completion of all steps shown in FIG. 1A.

As described above, certain steps of a typical production flow can cause data stored on a memory of an IC die to be lost or corrupted. In particular, a reflow process used in attaching the IC die to a PCB (described in further detail below) typically uses relatively high temperatures, which can result in the aforementioned data loss. In the context of FIG. 1A, such a reflow process can cause the program code written to the memory to be corrupted or lost. Under conventional approaches, when the program code is corrupted or lost, both the IC die and the PCB are rendered useless and may be scrapped, which is undesirable and can be costly.

The approaches of the instant disclosure provide systems and methods for ensuring the integrity of the program code following the high-temperature reflow process. More specifically, the approaches of the instant disclosure provide systems and methods for correcting errors in the program code that result from the reflow process. Thus, although the reflow process may cause bit values to change in the memory, the systems and methods described herein enable these bit values to be corrected and returned to their original values. The final product delivered to the customer thus includes the program code programmed at the step 112, with no undesirable variations or corruption resulting from the reflow process. In contrast to the conventional approaches, when the reflow process causes changes to the bit values stored in the memory, the IC die and PCB need not be scrapped. Consequently, yield loss and the number of scrapped IC dies and PCBs are reduced.

In the embodiment of FIG. 1A, the integrity of the program code is ensured through the use of error check and correction (ECC) parity bits. Specifically, at the step 112, in writing the program code to the memory, both data bits and parity bits are written to the memory. The data bits comprise the actual program code, and the parity bits comprise ECC bits that correspond to the data bits. In examples, the data written to the memory comprises ECC words, where each ECC word includes (m+p) bits, with m data bits and p parity bits. In an example, m is equal to 10, and p is equal to 5. With this configuration, the p parity bits enable a certain number of bit errors in the ECC word to be corrected. For instance, in an example, the p parity bits enable a single erroneous bit in the ECC word to be corrected. In another example, the p parity bits enable two erroneous bits to be corrected. In some instances, the ECC word has a number of errors that cannot be corrected using the p parity bits. Generally, a number of errors that can be corrected increases with the number of parity bits utilized. Such parity bits come at a cost, however, as they consume space in the memory that could otherwise be used to store actual data. As described below, the parity bits written to the memory at the step 112 enable detection and correction of errors in the program code that result from the reflow process.

At step 114, the IC package is attached to a PCB. The PCB is used as a base frame to mechanically support and electrically connect electronic IC packages using conductive pathways, tracks, or signal traces etched from copper sheets laminated onto a non-conductive substrate. Surface-mount technology (SMT) is a method for constructing electronic circuits in which an IC package is mounted directly onto the surface of a PCB. In examples, the IC package is mounted directly on the surface of the PCB. Connectors (e.g., solder balls) of the IC package are placed on contact pads of the PCB. A reflow process is then performed at a relatively high temperature (e.g., 260 degrees Celsius) to reflow the connectors of the IC package and the PCB contact pads to form a mechanical and electrical connection between the connectors and the contact pads.

The reflow process performed at the step 114 can cause errors in the program code programmed into the memory. Specifically, bit values stored in the memory can change as a result of the high-temperature reflow process (e.g., the reflow process can cause bit values of "0" to change to "1," and vice versa). To correct the data errors caused by the reflow process, the example method of FIG. 1A includes the steps 116, 120. In the step 116, the parity bits written to the memory are used to detect errors in the program code stored in the memory, where such errors are the result of the relatively high-temperature reflow process. If one or more errors are detected, a determination is made as to whether the errors can be corrected based on the parity bits. If the number of parity bits is not sufficient to correct the detected errors, then the IC package and PCB are scrapped at step 118, in examples.

If the number of parity bits is sufficient to correct the detected errors, then at step 120, such correction is performed. At the step 120, program code is rewritten into the failed bits of the memory (e.g., those bits that changed as a result of the reflow process) based on the parity bits, and the parity bits are released from the memory. It is noted that in some embodiments, the parity bits are not released. In cases where the parity bits are maintained (e.g., not released), these parity bits can be used to prevent certain failures (e.g., retention failures, read disturbs, etc.). In embodiments where the parity bits are released, space in the memory is made available for other uses. Subsequently, at step 122, the assembly comprising the IC package attached to the PCB is finished and can be shipped to a user (e.g., a customer). The final product that is shipped includes the program code programmed at the step 112, with no undesirable variations or corruption resulting from the reflow process.

Figure 1B:
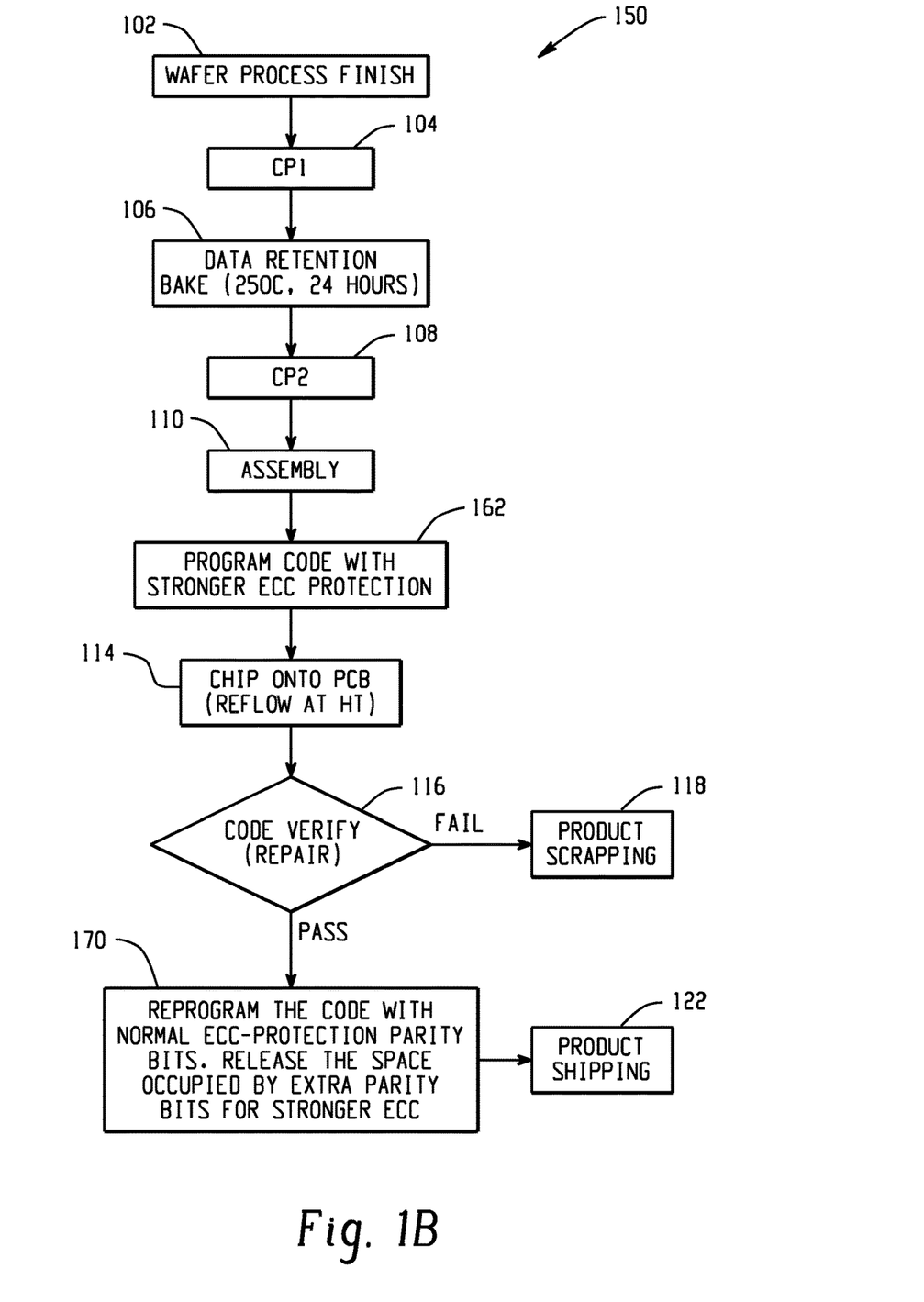
FIG. 1B depicts operations of another example method for forming a device, in accordance with some embodiments.

FIG. 1B depicts operations of another example method 150 for forming a device, in accordance with some embodiments. This figure depicts operations that are the same as or similar to those of FIG. 1A, and like reference numerals are used to designate like operations in these figures. At step 162, a code programming step is performed. In the code programming step 162, similar to the code programming step 112 of FIG. 1A, bits of data are written to the memory formed on the IC die, where the bits of data comprise program code, in examples. Further, at the step 162, in writing the program code to the memory, both data bits and parity bits are written to the memory.

The code programming step 162 of FIG. 1B differs from the code programming step 112 of FIG. 1A in the number of parity bits that are utilized. Specifically, a larger number of parity bits are utilized in the step 162 of FIG. 1B, as compared to the step 112 of FIG. 1A. By using the larger number of parity bits, stronger ECC protection is provided, thus enabling higher bit-error-rates to be corrected after the reflow process performed at the step 114. The larger number of parity bits comes at a cost, as they occupy space of the memory that could otherwise be used to store actual data. Incurring this cost, however, may be worthwhile, as a lower yield loss and less product scrapping may be realized due to the fact that more errors can be corrected.

Following the step 162 of FIG. 1B, the steps 114 and 116 are performed. If the number of parity bits is not sufficient to correct errors detected at the step 116, then the IC package and PCB are scrapped at step 118, in examples. If the number of parity bits is sufficient to correct the detected errors, then at step 170, such correction is performed. At the step 170, the corrected program code is rewritten into the memory with normal ECC-protection parity bits. The number of parity bits used in the normal ECC-protection configuration is less than that used in the stronger ECC-protection configuration of the step 162. Further, some or all of the space occupied by the stronger ECC-protection parity bits is released, in embodiments, thus freeing up this space for other uses. Specifically, the stronger ECC-protection parity bits can all be released or such bits can be partially released and rewritten. In examples where the stronger ECC-protection parity bits are partially released and rewritten, the remaining parity bits can serve as protection for future uses.

At the completion of the step 170, the final product is complete and can be shipped at the step 122. At the completion of the method of FIG. 1B, the final product that is shipped includes the program code programmed at the step 162, with no undesirable variations or corruption resulting from the reflow process. In the examples of FIGS. 1A and 1B, integrity of the program code is ensured through the use of ECC parity bits, as described above. Other examples described herein ensure the integrity of the program code using other systems and methods.

In the example of FIGS. 2A-2F, integrity of the program code is ensured through the use of a screening step that is performed prior to the reflow process. The screening step is performed to identify memory locations that are susceptible to data loss when subjected to elevated temperatures. After a reflow process is performed at an elevated temperature, data stored in the identified memory locations is checked and corrected, if necessary. The identifying of the weak bits and the correcting of the data helps to ensure that no data is lost as a result of the reflow process. As referred to herein, the term "elevated temperature" encompasses temperatures used in processing an IC die that are above room temperature. In some examples, an elevated temperature is a temperature utilized in a reflow process (e.g., 260 degrees Celsius). In such examples, the screening step is performed to identify memory locations that are susceptible to data loss when subjected to temperatures utilized in the reflow process.

Figure 2A:
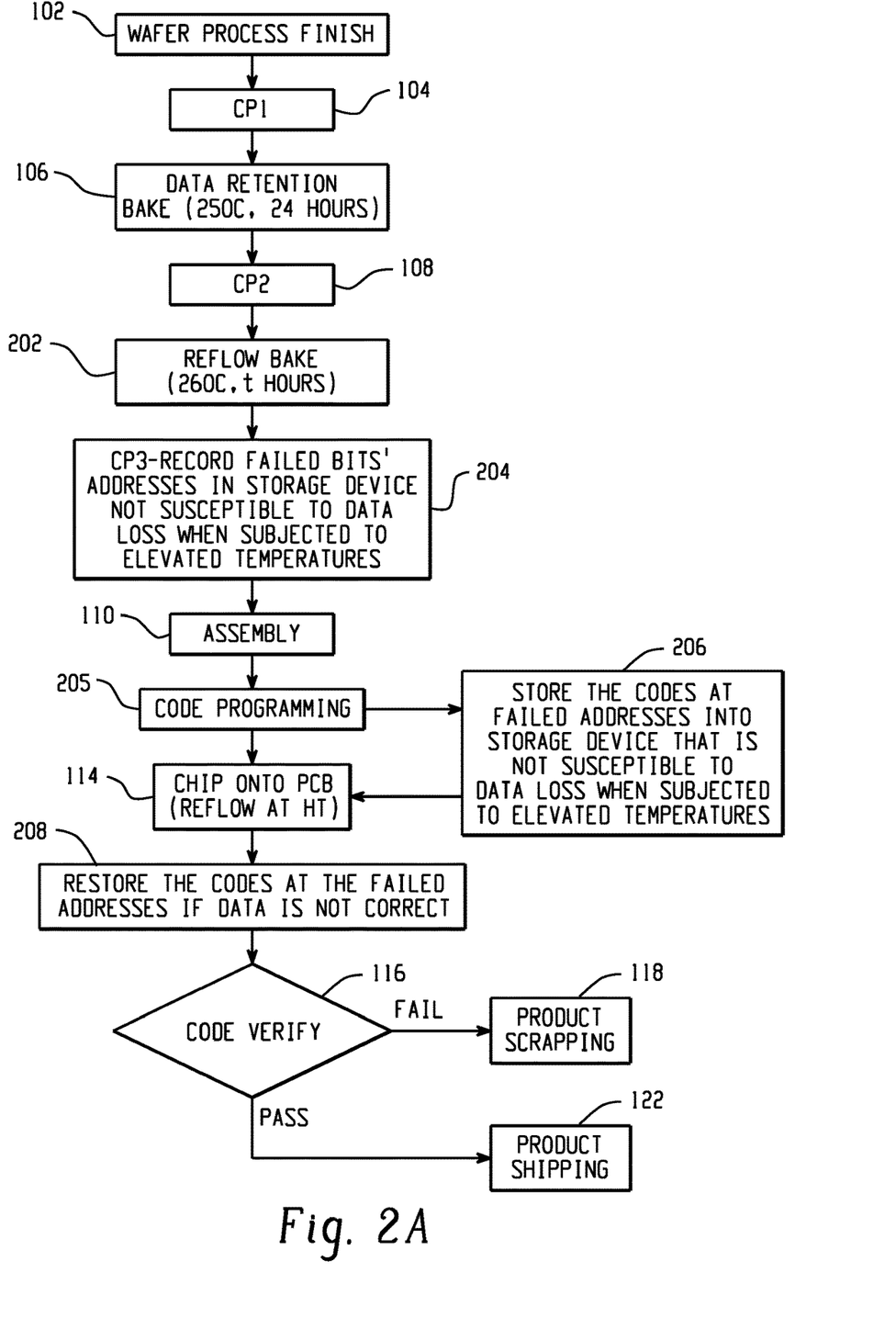
FIG. 2A depicts operations of an example method for correcting data stored on a memory following a reflow process, in accordance with some embodiments.

To illustrate such screening and correction of data, reference is made to FIG. 2A. This figure depicts operations that are the same as or similar to those of FIG. 1A, and like reference numerals are used to designate like operations in these figures. Following the step 106, operations are performed to determine addresses of memory locations that are susceptible to data loss when subjected to elevated temperatures. The determination of such addresses may be referred to herein as a "screening" process. In the screening process, the step 108 is performed. In the step 108, one or more steps of a second CP stage are performed, with such steps being the same as or similar to those described above with reference to FIG. 1A. Additionally, at the step 108, dummy bits having predetermined values are written to the memory. The writing of the dummy bits is used in determining the addresses of the memory locations that are susceptible to data loss when subjected to elevated temperatures.

Figure 2B:
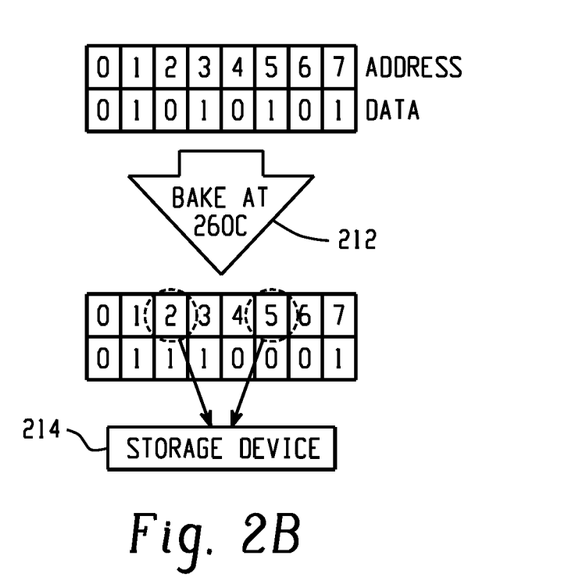
FIG. 2B depicts a memory and a storage device formed on an IC die, in accordance with some embodiments.

To illustrate the writing of such dummy bits to the memory, reference is made to FIG. 2B. This figure depicts eight (8) memory locations of the memory, which have corresponding memory addresses (i.e., addresses labeled 0-7, in the illustration of FIG. 2B). In the second CP stage performed at 108, dummy bits (which may also be referred to as a "background") having predetermined values are written to the eight memory locations. The predetermined values are "01010101" in the example of FIG. 2B, with such values being written to the memory locations corresponding to the respective addresses 0-7.

With reference again to FIG. 2A, step 202 is performed after writing the dummy bits to the memory. In the step 202, the IC die is subjected to a simulated reflow bake. As described above, in attaching an IC package to a PCB, a reflow process is performed at a relatively high temperature (e.g., 260 degrees Celsius). This reflow process is performed at the step 114 shown in FIG. 2A. The reflow bake performed at the step 202 is intended to simulate this subsequent reflow process and thus involves subjecting the IC die to a same or similar temperature as is used in the reflow process. The reflow bake subjects the IC die to this temperature for a same or similar amount of time as is used in the reflow process. Thus, for example, if the reflow process performed at the step 114 includes subjecting the IC die to a temperature of 260 degrees Celsius fort hours (e.g., 2 hours, etc.), then the simulated reflow bake performed at the step 202 likewise includes subjecting the IC die to a same or similar temperature for a same or similar amount of time.

At step 204, memory addresses of dummy bits that have changed values as a result of the simulated reflow bake are determined. Further, at the step 204, the determined memory addresses are written to a storage device of the IC die that is not susceptible to data loss when subjected to elevated temperatures. To illustrate the steps 202 and 204, reference is made again to FIG. 2B. In this figure, after writing the dummy bits (i.e., having bit values "01010101"), the simulated reflow bake is performed at 212. Next, addresses of dummy bits that have changed as a result of the simulated reflow bake are determined. In the example of FIG. 2B, dummy bits at memory addresses "2" and "5" have changed as a result of the simulated reflow bake. The determining of these addresses includes, in examples, comparing the bit values stored in the memory locations following the simulated reflow bake to the known, predetermined values of the dummy bits. The memory addresses "2" and "5" are written to a storage device 214 of the IC die that is not susceptible to data loss when subjected to elevated temperatures.

As noted above, the term "elevated temperature" encompasses temperatures used in processing an IC die that are above room temperature. In some examples, an elevated temperature is a temperature utilized in a reflow process. In such examples, the storage device 214 is a storage device that does not experience data loss or corruption when subjected to temperatures utilized in the reflow process.

Figure 2C:
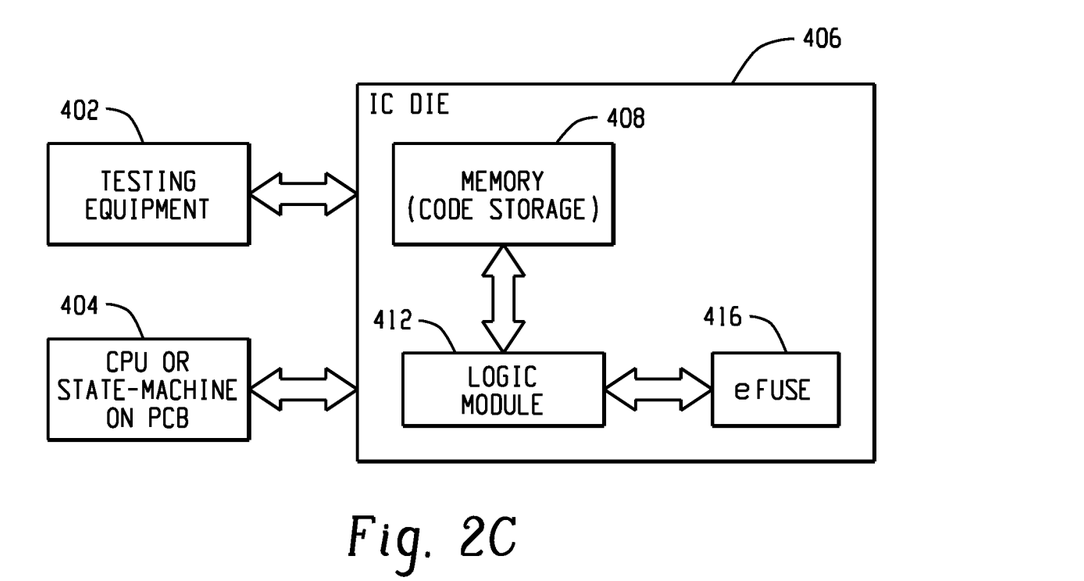
FIGS. 2C and 2D depict example apparatuses including testing equipment, a CPU or state machine formed on a printed circuit board (PCB), and an IC die, in accordance with some embodiments.

To illustrate an example storage device that is not susceptible to data loss when subjected to elevated temperatures, reference is made to FIG. 2C. This figure depicts an example apparatus including testing equipment 402, a CPU or state machine 404 formed on a PCB, and an IC die 406, in accordance with some embodiments. The IC die 406 is an IC die that is to be attached to a PCB and subjected to the elevated temperatures of the reflow process. Included on the IC die 406 is a memory 408, which comprises an emerging memory (e.g., MRAM, RRAM, FRAM, PCRAM, etc.), in examples. The memory 408 is used for storing data, such as the program codes described herein. The testing equipment 402 is used in performing the operations 104, 106, 108, 202, 204 shown in FIG. 2A. Thus, the testing equipment 402 performs the chip probing operations and writes the dummy bits to the memory 408, in examples.

The testing equipment 402 also (i) determines the memory addresses of dummy bits that have changed values as a result of the simulated reflow bake, and (ii) records these memory addresses in a storage device of the IC die 406 that is not susceptible to data loss when subjected to elevated temperatures. In the example of FIG. 2C, this storage device is an electronically programmable fuse (e-fuse) 416, known to those of ordinary skill in the art. The e-fuse 416 is a one-time programmable, non-volatile memory device that can be subjected to the relatively high temperatures of the reflow process without data loss or corruption. Thus, in examples, the testing equipment 402 determines the memory addresses of the dummy bits that have changed values as a result of the simulated reflow bake and writes these memory addresses to the e-fuse 416.

In other examples, the storage device of the IC die 406 that is not susceptible to data loss when subjected to elevated temperatures comprises a "spare array" of memory formed on the IC die 406. To illustrate an example of this, reference is made to FIG. 2D, which illustrates a spare array of memory 410. In examples, the spare array 410 comprises a portion of the memory 408 that is not used for storing program code. In examples, portions of the spare array 410 are determined as having "strong bits," i.e., memory locations that should not experience data loss or corruption as a result of the reflow process. Such strong bits are in contrast to the "weak bits" of the memory 408, i.e., the memory locations that may experience a change in value as a result of the reflow process. The identification of the weak bits is illustrated in FIG. 2B and described above with reference to that figure.

Figure 2D:
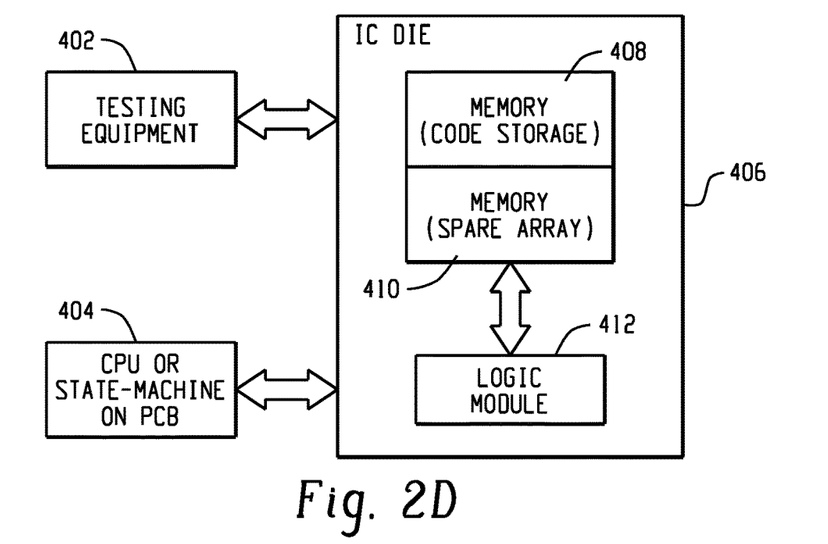
Figure 2E:
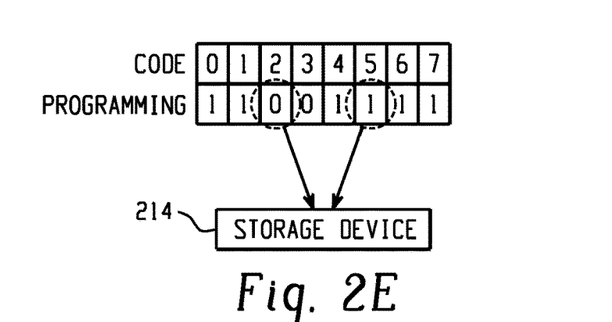
FIG. 2E depicts an example code programming step, in accordance with some embodiments.

In examples, the strong bits of the spare array 410 are identified via a screening process that is similar to the process described above for identifying the weak bits of the memory 408. For instance, dummy bits may be written to the spare array 410, and the simulated reflow bake may be utilized to determine dummy bits that have not changed as a result of the simulated reflow bake. In examples, the testing equipment 402 determines the memory addresses of the weak bits of the memory 408 and writes these memory addresses to the strong bits of the spare array 410. Because these memory addresses are written to the strong bits of the spare array 410, the subsequent reflow process should not cause this data to change or be lost. As described below, the strong bits of the spare array 410 are further used in storing duplicate data for correcting data errors in the memory 408 caused by the reflow process.

With reference again to FIG. 2A, at a completion of the step 204, addresses of memory locations that are susceptible to data loss when subjected to elevated temperatures have been determined. These addresses have been written to a storage device of the IC die that is not susceptible to data loss when subjected to elevated temperatures, as described above. It is noted that in embodiments, the step 202 is combined with the step 106. In such embodiments, the writing of the addresses that are susceptible to data loss to the storage device is performed at the step 108.

Next, at step 110, an assembly step is performed. As described above, this step includes assembling the IC die into an IC package. At step 205, a code programming step is performed. In the code programming step 205, bits of data are written to the memory (e.g., the memory 408 shown in FIGS. 2C and 2D) formed on the IC die. In examples, the bits of data comprise program code (e.g., computer executable instructions) executable by a processor, microcontroller, or state machine, for instance. The bits of data written to the memory include first bits of data that are written to the memory locations that are susceptible to data loss when subjected to the elevated temperatures. At step 206, the first bits of data are written to the storage device of the IC die that is not susceptible to data loss when subjected to the elevated temperatures. This storage device includes the e-fuse 416 or the spare array 410, as illustrated in FIGS. 2C and 2D, respectively.

Figure 2F:
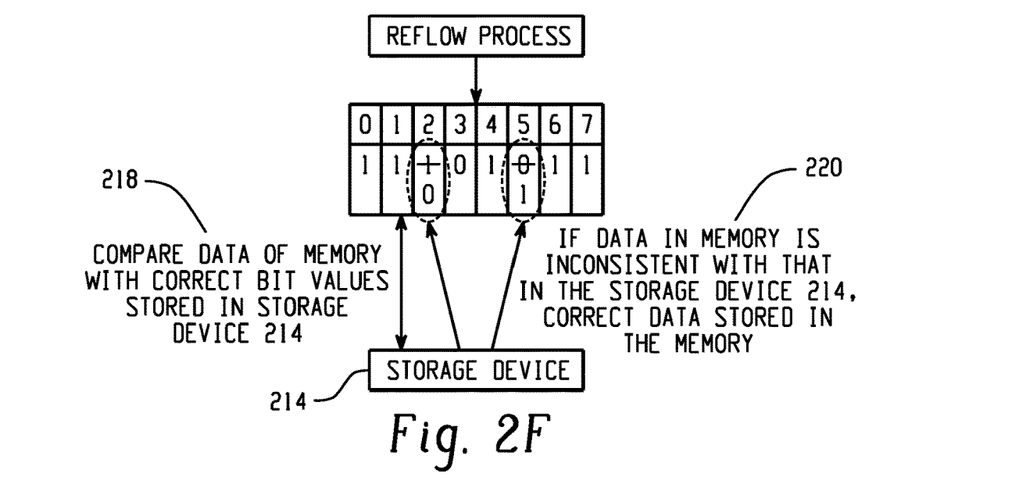
FIG. 2F depicts an example correction of data stored on a memory following a reflow process, in accordance with some embodiments.

To illustrate the steps 205 and 206, reference is made to FIG. 2F. This figure depicts the same eight memory locations of the memory that are shown in FIG. 2B. In the code programming step performed at the step 205, bits of data are written to the eight memory locations. In contrast to the "dummy bits" written to the memory locations in FIG. 2B, the bits of data shown in FIG. 2F are actual data and may comprise program code, as described above. The bits of data written to the memory locations include the values "11001111," as shown in the figure. These bits of data include bits of data "0" and "1" stored at memory addresses "2" and "5," respectively. The memory locations for the addresses "2" and "5" were previously determined as being susceptible to data loss when subjected to elevated temperatures (i.e., as part of the screening process described above and illustrated in FIG. 2B). Thus, these bits of data "0" and "1" for the memory addresses "2" and "5," respectively, are written to the storage device 214 that is not susceptible to data loss when subjected to elevated temperatures, as shown in the figure. In examples, the memory addresses of the bits of data "0" and "1" are also written to the storage device 214. Thus, in the storage device 214, the bit of data "0" may be associated with the memory address "2," and the bit of data "1" may be associated with the memory address "5."

With reference again to FIG. 2A, at step 114, the reflow process is performed, thus subjecting the IC die to an elevated, relatively-high temperature (e.g., 260 degrees Celsius). After the reflow process, at step 208, if the data stored at the weak bits of the memory are incorrect, then correct data is written to these memory locations. To illustrate the step 208, reference is made to FIG. 2F. As shown in this figure, after the reflow process, at 218, bits of data written to the storage device 214 are compared to corresponding bits stored at weak bits of the memory (i.e., memory locations that are susceptible to data loss when subjected to elevated temperatures). In the example of FIG. 2F, memory addresses "2" and "5" were previously identified as being weak bits, and so the bit values stored at these addresses (i.e., "1" and "0," respectively) are compared to corresponding bits stored in the storage device 214. As described above with reference to FIG. 2F, bits of data "0" and "1" for the memory addresses "2" and "5," respectively, are stored in the storage device 214.

In comparing the values stored in the memory with those stored in the storage device 214, it is apparent that the bit values stored in the memory locations "2" and "5" changed as a result of the reflow process, thus indicating a potential for data loss or corruption. To prevent such data loss or corruption, at 220, the bit values stored in the memory locations "2" and "5" are updated based on the comparing, such that they match the correct values stored in the storage device 214. The bit values stored in the storage device 214 are designated as being "correct" because the storage device 214 is not susceptible to data loss when subjected to elevated temperatures, thus ensuring that the bit values of the storage device 214 are not changed as a result of the reflow process.

In some examples, the comparison described above is not performed. In these examples, after the reflow process is performed, data stored in the weak bits of the memory are overwritten with correct data stored in the storage device 214.

With reference again to FIG. 2A, in a subsequent step 116, an error checking step is performed. If errors are detected, then the IC package and PCB are scrapped at step 118, in examples. In other examples, if ECC bits are written to the memory, then error correction based on the ECC bits is attempted at the step 118. If no errors are detected in the error checking step (or if any such errors are corrected using ECC), then at step 122, the assembly comprising the IC package attached to the PCB is finished and can be shipped. The final product that is shipped includes the program code programmed at the step 205, with no undesirable variations or corruption resulting from the reflow process. It is expected that few, if any, errors should be detected at the error checking step 116, as most or all of the errors should be corrected as a result of the screening and rewriting processes described above. Because very few errors should be detected at the error checking step, chip design that does not utilize ECC or that utilizes smaller-area ECC may be utilized to realize macro area reduction.

Reference is made again to FIGS. 2C and 2D. The IC die 406 includes a logic module 412 (e.g., a logic module implemented in hardware, software, or some combination thereof) for carrying out operations 116, 205, 206, 208 shown in FIG. 2A. The logic module 412 is implemented using computer processors, computer logic, state machine(s), microcontrollers, ASIC, FPGA, DSP, etc., in examples. The logic module 412 is configured to perform encoding of data for storage in the memory 408, decoding of data that is read from the memory 408, and the rewriting of data in the memory 408 when bit values change as a result of the reflow process. The logic module 412 also controls data transfers within the memory 408 (e.g., data transfers between the spare array 410 and other portions of the memory 408) and data transfers between the memory 408 and the e-fuse 416.

In embodiments where the spare array 410 is utilized as the storage device that is not susceptible to data loss when subjected to elevated temperatures, the logic module 412 releases the data stored in the spare array 410 after error correction has been performed. The logic module 412 also performs the code programming step 112, code verify step 116, and code rewriting step 120 of FIG. 1A, and the code programming step 162, code verify step 116, and reprogramming/releasing step 170 of FIG. 1B. Thus, for instance, the logic module 412 is responsible for generating and writing parity bits to the memory 408, performing ECC error detection and correction following the reflow process, rewriting bits that fail the ECC testing, releasing parity bits after error correction, and reprogramming the code with normal ECC-protection parity bits, in examples. In embodiments, the testing equipment 402 or the CPU or state-machine on PCB 404 performs one or more of the functions described above as being performed by the logic module 412. It is thus noted that these functions may be performed on the IC die 406 (e.g., using the logic module 412), on the PCB (e.g., using the CPU or state-machine 404), or through the use of testing equipment 402 that is outside (e.g., separate from) both the IC die 406 and the PCB.

In the embodiments described above with reference to FIGS. 1A and 1B, ECC parity bits are written to a memory formed on an IC die, and these parity bits are used in correcting data errors in the memory following a reflow process. In embodiments described above with reference to FIGS. 2A-2F, duplicate data for weak bits of the memory are stored on a portion of the memory (e.g., a spare array 410), and this duplicate data is used in correcting data errors in the memory following a reflow process. In some embodiments, the actual program code to be stored on the memory is of a size that consumes most or all of the space of the memory. In these embodiments, there may be insufficient space for storing the parity bits or duplicate data. Further, even if there is sufficient space for storing some parity bits, it may be desirable to store additional parity bits for stronger ECC protection, and there may be insufficient space for storing these additional parity bits.

To address these issues, in examples, compressed code is written to the memory formed on the IC die in the code programming step (e.g., the code programming step 112, 162, or 205). The logic module 412 of the IC die is configured to compress the code and write the compressed code to the memory formed on the IC die, in examples. By writing this compressed code to the memory, there is sufficient space in the memory for the parity bits and/or the duplicate data, thus enabling the error correction techniques described above to be performed. After performing one or more of these error correction techniques to correct data errors resulting from the reflow process, the logic module 412 is configured to decompress the code stored in the memory. The logic module 412 releases the compressed code stored in the memory to free up additional space in the memory and writes the decompressed code to the memory. In examples where the program code comprises executable instructions, writing the decompressed code to the memory enables these instructions to be executed (e.g., in the field, by a user).

Figure 3:
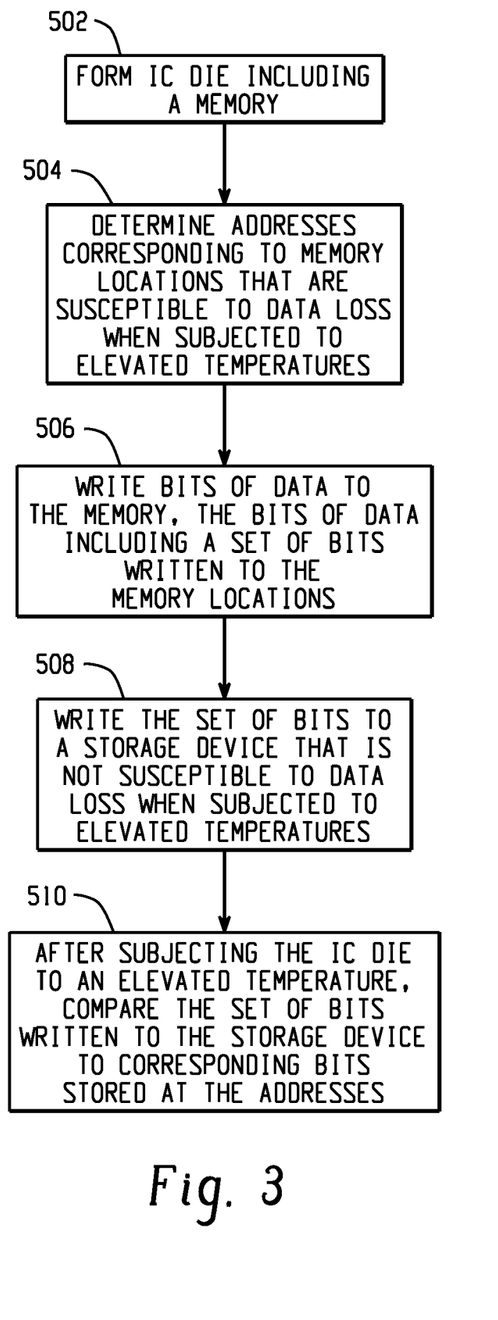
FIG. 3 depicts operations of an example method for forming a device, in accordance with some embodiments.

FIG. 3 depicts operations of an example method for forming a device, in accordance with some embodiments. At 502, an integrated circuit (IC) die (e.g., IC die 406 shown in FIG. 2C) including a memory (e.g., memory 408 shown in FIG. 2C) is formed. At 504, addresses of memory locations that are susceptible to data loss (e.g., addresses "2" and "5" shown in FIG. 2B) when subjected to elevated temperatures are determined. At 506, bits of data are written to the memory (e.g., data bits "11001111" written to addresses 0-7, shown in FIG. 2E), where the bits of data include a set of bits (e.g., data bit "0" written to address "2," and data bit "1" written to address "5," shown in FIG. 2E) written to the memory locations. At 508, the set of bits are written to a storage device (e.g., eFuse 416 shown in FIG. 2C, spare array 410 shown in FIG. 2D) of the IC die that is not susceptible to data loss when subjected to the elevated temperatures. At 510, at least one of the bits stored at the addresses is overwritten (e.g., as shown in operation 220 of FIG. 2F) after subjecting the IC die to an elevated temperature. The at least one of the bits is overwritten based on the set of bits written to the storage device.

Figure 4:
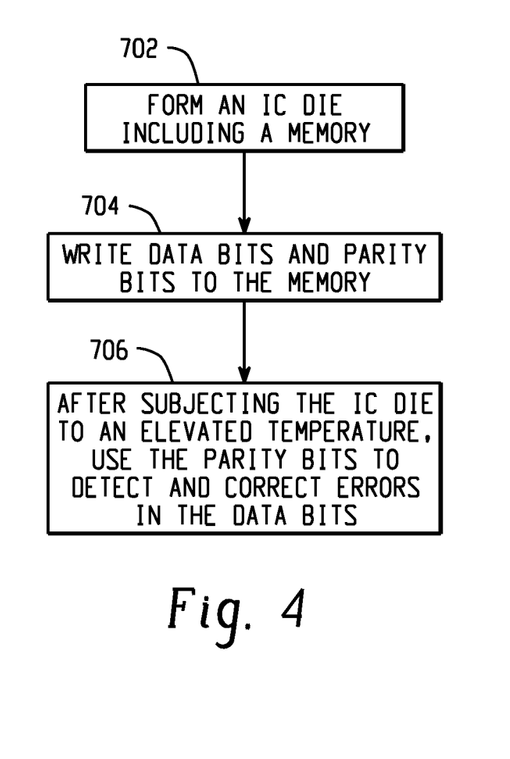
FIG. 4 depicts operations of another example method for forming a device, in accordance with some embodiments.

FIG. 4 depicts operations of another example method for forming a device, in accordance with some embodiments. At 702, an IC die (e.g., IC die 406 shown in FIG. 2C) including a memory (e.g., memory 408 shown in FIG. 2C) is formed. At 704, data bits and parity bits corresponding to the data bits are written to the memory. At 706, the parity bits are used to detect and correct errors in the data bits after subjecting the IC die to an elevated temperature.

The present disclosure is directed to systems and methods for correcting data errors in memory caused by high-temperature processing of the memory. According to some embodiments, a method of forming a device is disclosed. The method includes the steps of: forming an integrated circuit (IC) die including a memory having a plurality of memory locations; testing the IC die to determine addresses of a subset of the plurality of memory locations that are susceptible to data loss when subjected to elevated temperatures; writing bits of data to the plurality of memory locations, the bits of data including a subset of bits written to the subset of the plurality of memory locations that are susceptible to data loss when subjected to elevated temperatures; writing the subset of bits to a storage device of the IC die that is not susceptible to data loss when subjected to the elevated temperatures; attaching the IC die to a printed circuit board using a process during which the IC die is subjected to an elevated temperature, wherein the subset of bits comprise compressed code; overwriting at least one of the subset of bits stored at the subset of the plurality of memory locations of the memory with at least one of the subset of bits written to the storage device; depressing the compressed code; releasing the compressed code from the memory to make available space in the memory; and writing the decompressed code to the memory. According to some embodiments, the overwriting of the at least one of the subset of bits includes: comparing the subset of bits written to the storage device to corresponding bits stored at the addresses; and updating the at least one of the subset of bits stored at the addresses based on the comparing. According to some embodiments, the updating the at least one of the subset of bits based on the comparing includes: for compared bits having values that do not match, updating bit values in the memory based on values of the subset of bits stored in the storage device. According to some embodiments, the subjecting of the IC die to the elevated temperature includes: performing a reflow process at the elevated temperature to form a connection between the IC die and the printed circuit board (PCB). According to some embodiments, the storage device comprises an electronically programmable fuse. According to some embodiments, the method further includes: determining one or more portions of the memory that are not susceptible to data loss when subjected to the elevated temperatures, wherein the storage device comprises the one or more portions. According to some embodiments, the method further includes: releasing the subset of bits stored in the one or more portions to make available space in the memory after the overwriting updating of the at least one of the subset of bits. According to some embodiments, the determining of the addresses comprises: writing dummy bits having predetermined values to the memory; performing a process on the IC die at the elevated temperature; after the process, determining memory addresses of dummy bits that have changed values as a result of the process, the memory addresses comprising the addresses of the memory locations that are susceptible to data loss when subjected to the elevated temperatures; and writing the memory addresses to the storage device. According to some embodiments the determining of the addresses is performed during one or more chip probing stages of a production process. According to some embodiments, the bits of data written to the memory comprise compressed code, the method further includes: decompressing the compressed code stored in the memory after the overwriting; releasing the compressed code from the memory to make available space in the memory; and writing the decompressed code to the memory.

According to some embodiments, an integrated circuit (IC) die is disclosed. The IC die includes: a memory including a plurality of memory locations, the plurality of memory locations including a subset of memory locations determined during testing to be susceptible to data loss when subjected to elevated temperatures; a storage device that is not susceptible to data loss when subjected to the elevated temperatures; and a logic module that is configured to write bits of data to the plurality of memory locations, the bits of data including a subset of bits written to the subset of memory locations that are susceptible to data loss when subjected to elevated temperature, wherein the subset of bits comprise compressed code, write the subset of bits to the storage device, and after the IC die has been subjected to an elevated temperature, overwrite at least one of the subset of bits stored in the subset of the plurality of memory locations of the memory with at least one of the subset of bits written to the storage device; decompress the compressed code; release the compressed code from the memory to make available space in the memory; and write the decompressed code to the memory. According to some embodiments, the storage device comprises an electronically programmable fuse. According to some embodiments, the storage device comprises one or more portions of the memory that are not susceptible to data loss when subjected to elevated temperatures. According to some embodiments, the overwriting of the at least one of the subset of bits includes: comparing the subset of bits written to the storage device to corresponding bits stored at the addresses; and updating the at least one of the subset of bits stored at the addresses based on the comparing.

According to some embodiments, a circuit package is disclosed. The circuit package includes: a printed circuit board; and an integrated circuit die coupled to the printed circuit board by solder bonds that are created using a solder bonding process during which the integrated circuit is subjected to an elevated temperature, the integrated circuit die comprising, a memory including a plurality of memory locations, the plurality of memory locations including a subset of memory locations determined during testing to be susceptible to data loss when subjected to elevated temperatures, a storage device that is not susceptible to data loss when subjected to the elevated temperatures, and a logic module that is configured to write bits of data to the plurality or memory locations, the bits of data including a subset of bits written to the subset of memory locations that are susceptible to data loss when subjected to elevated temperatures, wherein the subset of bits comprise compressed code, write the subset of bits to the storage device, and after the IC die has been subjected to the elevated temperature during the solder bonding process, overwrite at least one of the subset of bits stored in the subset of the plurality of memory locations of the memory with at least one of the subset of bits written to the storage device, decompress the compressed code; release the compressed code from the memory to make available space in the memory; and write the decompressed code to the memory. According to some embodiments, the storage device comprises an electronically programmable fuse. According to some embodiments, the storage device comprises one or more portions of the memory that are not susceptible to data loss when subjected to elevated temperatures. According to some embodiments, the overwriting of the at least one of the subset of bits includes: comparing the subset of bits written to the storage device to corresponding bits stored at the addresses; and updating the at least one of the subset of bits stored at the addresses based on the comparing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   writing bits of data to memory locations of a memory of an integrated circuit (IC) that are susceptible to data loss when the IC is subjected to a post-IC production process, wherein the bits of data comprise compressed code;
   writing the bits of data to a storage device of the IC that is not susceptible to data loss when the IC is subjected to the post-IC production process; and
   after the IC is subjected to the post-IC production process, overwriting at least one of the bits stored at the memory locations with at least one of the bits from the storage device.

2. The method of claim 1, wherein the overwriting comprises comparing bits in the storage device to corresponding bits in the memory.

3. The method of claim 2, further comprising, for compared bits that do not match, updating bit values in the memory based on values stored in the storage device.

4. The method of claim 1, wherein the post-IC production process is a reflow process that forms a connection between the IC and a printed circuit board (PCB).

5. The method of claim 1, wherein the storage device comprises an electronically programmable fuse.

6. The method of claim 1, further comprising:
   determining one or more portions of the memory that are not susceptible to data loss when the IC is subjected to a simulated post-IC production process, wherein the storage device comprises the one or more portions;
   decompressing the compressed code;
   releasing the compressed code from the memory to make available space in the memory; and
   writing the decompressed code to the memory.

7. The method of claim 1, further comprising determining the memory locations of the memory that are susceptible to data loss by:
   writing dummy bits having predetermined values to the memory;

performing a simulated post-IC production process on the IC;

after performing the simulated post-IC production process, determining memory addresses of dummy bits that have changed values, the memory addresses comprising the addresses of the memory locations that are susceptible to data loss when the IC is subjected to the simulated post-IC production process; and writing the memory addresses to the storage device.

8. The method of claim 1, wherein the memory locations of the memory that are susceptible to data loss are determined during one or more chip probing stages of a production process.

9. An integrated circuit (IC) comprising:
a logic module configured to:
write bits of data to a plurality of memory locations of a memory, the bits of data including a subset of bits written to a subset of memory locations that are susceptible to data loss when the IC is subjected to a post-IC production process, wherein the subset of bits comprise compressed code,
write the subset of bits to a storage device, and
after the IC has been subjected to the post-IC production process, overwrite at least one of the subset of bits stored in the subset of the plurality of memory locations with at least one of the subset of bits written to the storage device.

10. The IC of claim 9, wherein the logic module is further configured to:
decompress the compressed code;
release the compressed code from the memory to make available space in the memory; and
write the decompressed code to the memory, wherein the storage device comprises an electronically programmable fuse.

11. The IC of claim 9, wherein the storage device comprises one or more portions of the memory that are not susceptible to data loss when subjected to the post-IC production process.

12. The IC of claim 9, wherein the logic module overwrites the at least one of the subset of bits by:
comparing the subset of bits written to the storage device to corresponding bits stored at the addresses; and
updating the at least one of the subset of bits stored at the addresses based on the comparing.

13. The IC of claim 9, wherein the subset of memory locations that are susceptible to data loss are determined by:
writing dummy bits having predetermined values to the memory;
performing a simulated post-IC production process on the IC; and
after performing the simulated post-IC production process, determining memory addresses of dummy bits that have changed values, the memory addresses comprising the addresses of the memory locations that are susceptible to data loss when the IC is subjected to the simulated post-IC production process.

14. The IC of claim 9, wherein the storage device is identified as one or more portions of the memory that are not susceptible to data loss when the IC is subjected to the post-IC production process.

15. A circuit package comprising:
an integrated circuit (IC) comprising:
a memory including a plurality of memory locations, the plurality of memory locations including a subset of memory locations susceptible to data loss when the IC is subjected to a post-IC production process,
a storage device that is not susceptible to data loss when subjected to the post-IC production process, and
a logic module configured to:
write bits of data to the plurality of memory locations, the bits of data including a subset of bits written to the subset of memory locations that are susceptible to data loss when the IC is subjected to the post-IC production process, wherein the subset of bits comprise compressed code,
write the subset of bits to the storage device, and
after the IC has been subjected to the post-IC production process, overwrite at least one of the subset of bits stored in the subset of the plurality of memory locations with at least one of the subset of bits written to the storage device.

16. The circuit package of claim 15, wherein the logic module is further configured to:
decompress the compressed code;
release the compressed code from the memory to make available space in the memory; and
write the decompressed code to the memory, wherein the storage device comprises an electronically programmable fuse.

17. The circuit package of claim 15, wherein the storage device comprises one or more portions of the memory that are not susceptible to data loss when subjected to the post-IC production process.

18. The circuit package of claim 15, wherein the logic module overwrites the at least one of the subset of bits by:
comparing the subset of bits written to the storage device to corresponding bits stored at the addresses; and
updating the at least one of the subset of bits stored at the addresses based on the comparing.

19. The circuit package of claim 15, wherein the subset of memory locations that are susceptible to data loss are determined by:
writing dummy bits having predetermined values to the memory;
performing a simulated post-IC production process on the IC; and
after performing the simulated post-IC production process, determining memory addresses of dummy bits that have changed values, the memory addresses comprising the addresses of the memory locations that are susceptible to data loss when the IC is subjected to the simulated post-IC production process.

20. The circuit package of claim 15, wherein the storage device is identified as one or more portions of the memory that are not susceptible to data loss when the IC is subjected to the simulated post-IC production process.

* * * * *